US012772782B2

(12) United States Patent
Park et al.

(10) Patent No.: US 12,772,782 B2
(45) Date of Patent: Oct. 20, 2026

(54) SUBSTRATE PROCESSING APPARATUS AND SUBSTRATE PROCESSING METHOD

(71) Applicant: Samsung Electronics Co., Ltd., Suwon-si (KR)

(72) Inventors: Sangjine Park, Suwon-si (KR); Jihwan Park, Suwon-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 18/520,047

(22) Filed: Nov. 27, 2023

(65) Prior Publication Data

US 2024/0178024 A1 May 30, 2024

(30) Foreign Application Priority Data

Nov. 28, 2022 (KR) ........................ 10-2022-0162031

(51) Int. Cl.

*H10P 72/00* (2026.01)
*H10P 72/50* (2026.01)
*H10P 76/20* (2026.01)

(52) U.S. Cl.

CPC ...... *H10P 72/0606* (2026.01); *H10P 72/0402* (2026.01); *H10P 72/0431* (2026.01); *H10P 72/0462* (2026.01); *H10P 72/0604* (2026.01); *H10P 72/53* (2026.01); *H10P 76/2041* (2026.01)

(58) Field of Classification Search

None

See application file for complete search history.

(56) References Cited

U.S. PATENT DOCUMENTS

| | | | |
|---|---|---|---|
| 9,027,576 | B2 | 5/2015 | Cho et al. |
| 9,662,685 | B2 | 5/2017 | Goshi et al. |
| 10,197,333 | B2 | 2/2019 | Kim et al. |
| 11,227,761 | B2 | 1/2022 | Jeong et al. |
| 2022/0136111 | A1 | 5/2022 | Cho et al. |
| 2022/0205782 | A1 | 6/2022 | Choi et al. |

FOREIGN PATENT DOCUMENTS

| | | | |
|---|---|---|---|
| KR | 10-2006-0026245 | A | 3/2006 |
| KR | 10-1681190 | B1 | 12/2016 |
| KR | 10-2018-0086165 | A | 7/2018 |
| KR | 10-2022-025346 | A | 3/2022 |
| KR | 10-2417011 | B1 | 7/2022 |

*Primary Examiner* — Binu Thomas

(74) *Attorney, Agent, or Firm* — Muir Patent Law, PLLC

(57) ABSTRACT

Provided is a substrate processing apparatus including a processing container having a processing space, a substrate support configured to support a substrate, a fluid supplier configured to supply a processing fluid in a supercritical state to the processing space, a shower head assembly configured to diffuse the processing fluid, a first laser portion configured to measure a horizontal alignment between the processing container and the shower head assembly, a second laser portion configured to measure a vertical alignment between the processing container and the shower head assembly, and a controller configured to correct the position of one of the substrate, the shower head assembly, and the processing container, based on the measured horizontal and vertical alignments, wherein the first and second laser portions are configured to be positioned within the processing container and to move above the substrate.

17 Claims, 15 Drawing Sheets

SUBSTRATE PROCESSING APPARATUS AND SUBSTRATE PROCESSING METHOD

CROSS-REFERENCE TO RELATED APPLICATION

This application is based on and claims priority under 35 U.S.C. § 119 to Korean Patent Application No. 10-2022-0162031, filed on Nov. 28, 2022, in the Korean Intellectual Property Office, the disclosure of which is incorporated by reference herein in its entirety.

BACKGROUND

The inventive concept relates to a substrate processing apparatus and a substrate processing method.

As semiconductor devices are getting miniaturized, extreme ultraviolet (EUV) lithography using a very short wavelength (about 13.5 nm) has been proposed. Using such EUV lithography, a photoresist pattern having a small critical dimension and a high aspect ratio may be formed. While a technique using supercritical fluid has been studied in order to prevent collapse of photoresist patterns in the process of forming fine photoresist patterns, there are still issues to be addressed/improved, such as particle defects formed on a substrate during the production process for semiconductor devices.

SUMMARY

Aspects of the inventive concept provide a substrate processing apparatus and a substrate processing method for improving the uniformity of substrate processing.

In addition, aspects of the inventive concept are not limited to the mentioned above, and additional aspects of the inventive concept will be clearly understood by those skilled in the art from the following description.

According to an aspect of the inventive concept, there is provided a substrate processing apparatus including a processing container having a processing space, a substrate support configured to support a substrate within the processing container, a fluid supplier configured to supply a processing fluid in a supercritical state to the processing space through a container supply pipe, a shower head assembly configured to diffuse the processing fluid supplied from the fluid supplier to the processing space, a first laser portion configured to measure a horizontal alignment between the processing container and the shower head assembly, a second laser portion configured to measure a vertical alignment between the processing container and the shower head assembly, and a controller configured to correct the position of one of the substrate, the shower head assembly, and the processing container based on the measured horizontal and vertical alignments, wherein the first and second laser portions are configured to be positioned within the processing container and to move above the substrate.

According to another aspect of the inventive concept, there is provided a substrate processing apparatus including a processing container having a processing space, a substrate support configured to support a substrate within the processing container, a fluid supplier configured to supply a processing fluid in a supercritical state to the processing space through a container supply pipe, a shower head assembly configured to diffuse the processing fluid supplied from the fluid supplier to the processing space, a first laser portion configured to measure a horizontal alignment between the processing container and the shower head assembly, a second laser portion configured to measure a vertical alignment between the processing container and the shower head assembly, a jig configured to be positioned between the substrate and the laser portion when the substrate is disposed on the substrate support, and a gyro sensor configured to be mounted on the jig and to measure an inclination of the substrate and a lower body of the processing container, wherein each of the first laser portion and the second laser portion is configured to emit laser beams toward one of the processing container and the shower head assembly at at least three different points on the jig.

According to an aspect of the inventive concept, there is provided a substrate processing method including mounting a gyro sensor to a jig, measuring an inclination of a substrate and an inclination of a lower body of a processing container using the gyro sensor, correcting the position of the substrate and a position of the lower body based on the measured inclination of the lower body, mounting a first laser portion to the jig, measuring a horizontal width between an upper body of the processing container and a shower head assembly using the first laser portion, correcting the position of the shower head assembly based on the horizontal width, mounting a second laser portion to the jig, measuring a vertical distance from the top surface of the second laser portion to one of the upper body of the processing container and the shower head assembly using the second laser portion, and correcting the position of one of the upper body of the processing container and the shower head assembly based on the vertical distance.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
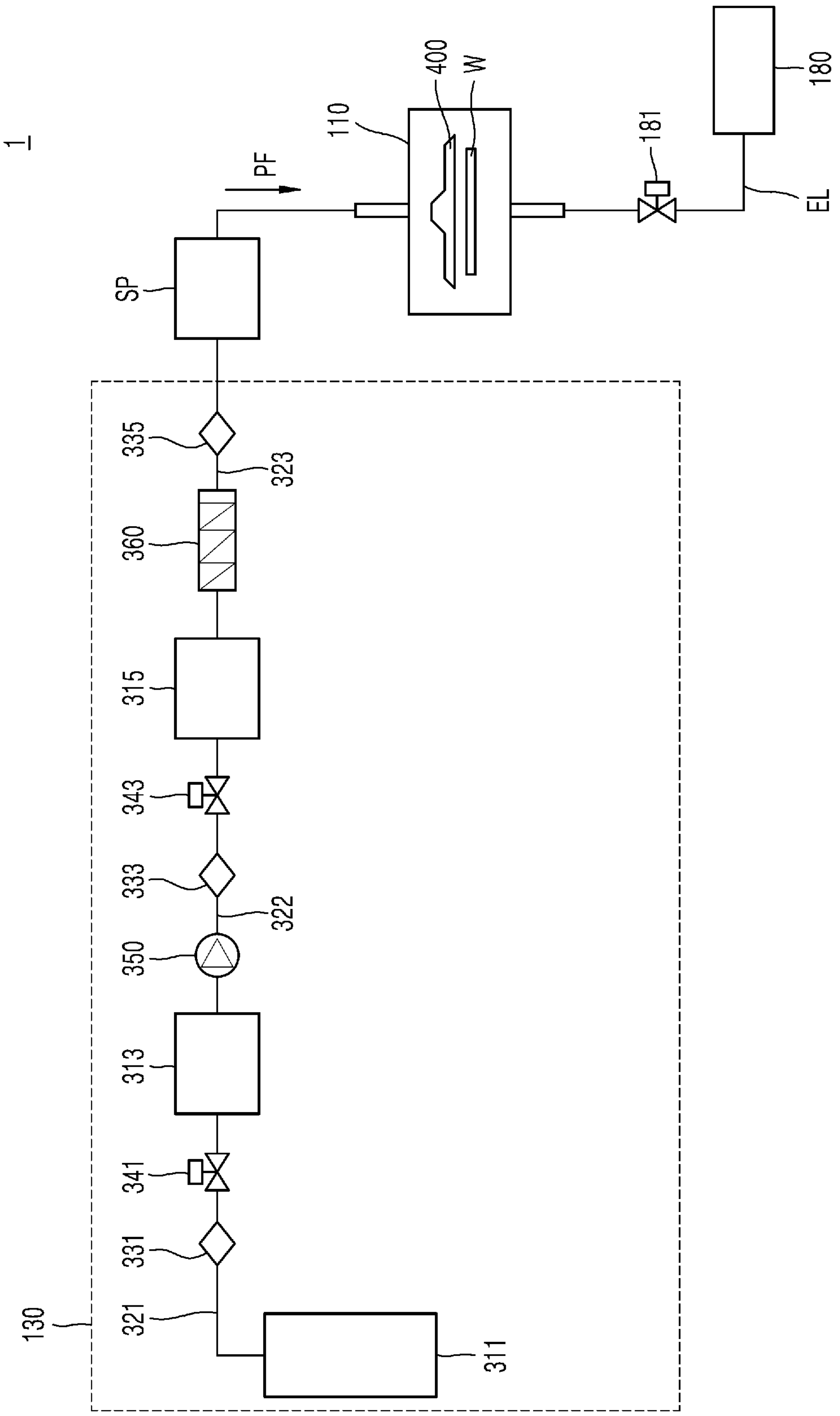
FIG. 1 is a configuration diagram showing a fluid supplier of a substrate processing apparatus according to an embodiment.

Hereinafter, embodiments will be described in detail with reference to the accompanying drawings. The same reference numerals are used for the same components in the drawings, and duplicate descriptions thereof are omitted.

FIG. 1 is a configuration diagram showing a fluid supplier 130 of a substrate processing apparatus 1 according to an embodiment.

Referring to FIG. 1, the fluid supplier 130 may include a fluid supply tank 311, a condenser 313, a pump 350, a storage tank 315, and a heater 360.

The fluid supply tank 311 may include raw materials. For example, the fluid supply tank 311 may store the processing fluid PF in a gaseous state. The condenser 313 may change the state of the processing fluid PF. The condenser 313 may cool the processing fluid PF to change the state of the processing fluid PF from a gaseous state to a liquid state. A first fluid supply line 321 connecting the fluid supply tank 311 and the condenser 313 may be provided with a filter 331 for filtering impurities in the processing fluid PF and a valve 341 for controlling the flow of the processing fluid PF. The first fluid supply line 321 may comprise or may be, for example, a pipe.

The pump 350 may be installed in (e.g., attached to) a second fluid supply line 322 extending between the condenser 313 and the storage tank 315. The pump 350 may drive the processing fluid PF so that the processing fluid PF liquefied by the condenser 313 is supplied to the storage tank 315 along the second fluid supply line 322. The second fluid supply line 322 connecting the condenser 313 and the storage tank 315 may be provided with a filter 333 for filtering impurities in the processing fluid PF and a valve 343 for controlling the flow of the processing fluid PF. The second fluid supply line 322 may comprise or may be, for example, a pipe.

The storage tank 315 may store the processing fluid PF, and may change the state of the processing fluid PF to a supercritical state. The storage tank 315 may heat the processing fluid PF through a built-in heater. The heater of the storage tank 315 may heat the processing fluid PF to a temperature equal to or higher than the critical temperature of the processing fluid PF. Accordingly, the processing fluid PF discharged from the storage tank 315 may be in a supercritical state. The processing fluid PF discharged from the storage tank 315 flows along a third fluid supply line 323, and then flows along a plurality of supply pipes SP from one end of the third fluid supply line 323.

The third fluid supply line 323 may be provided with the heater 360 configured to heat the processing fluid PF discharged from the storage tank 315 and a filter 335 for filtering impurities in the processing fluid PF. The heater 360 may heat the processing fluid PF moving along the third fluid supply line 323 to adjust the temperature of the processing fluid PF provided to a processing container 110. The heater 360 may include or may be an electrically resistive heater. The heater 360 may include or may be an inline heater and/or a jacket heater installed in the third fluid supply line 323.

Figure 2:
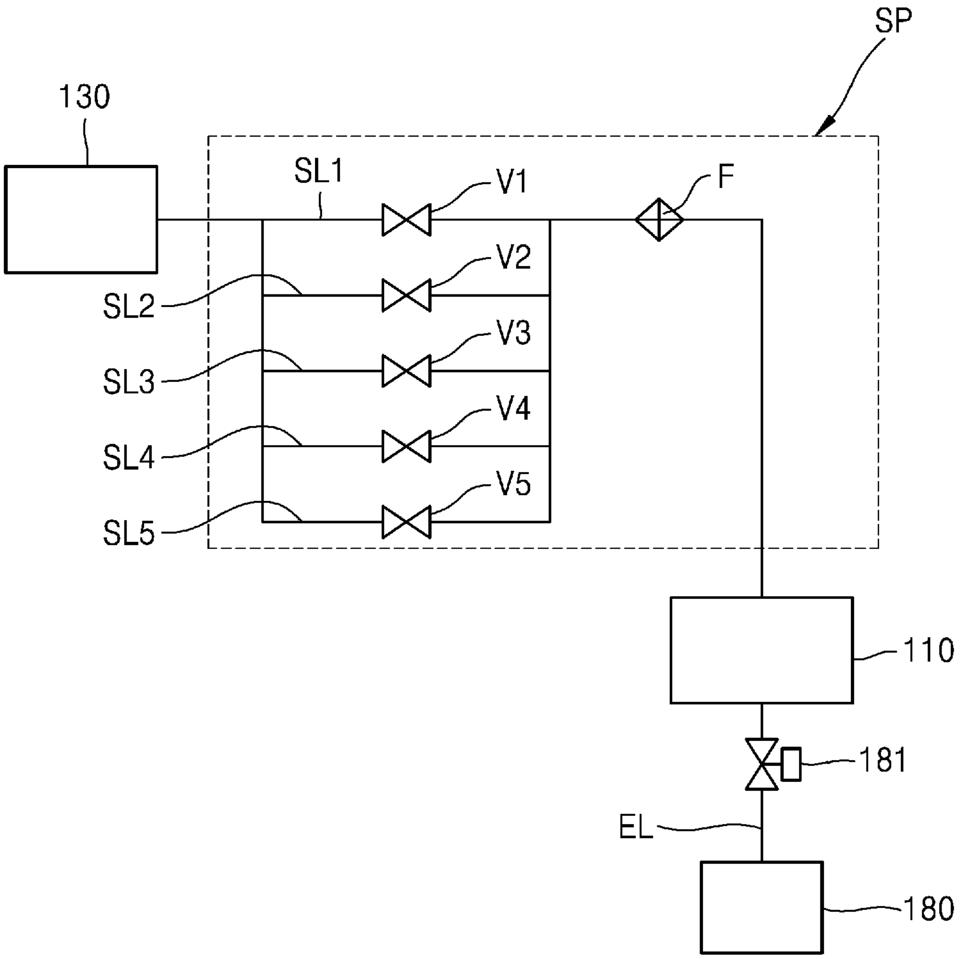
FIG. 2 is a configuration diagram showing a supply pipe of the substrate processing apparatus of FIG. 1.

FIG. 2 is a configuration diagram showing a supply pipe SP of the substrate processing apparatus 1 of FIG. 1.

Referring to FIG. 2, the supply pipe SP may connect the fluid supplier 130 and the processing container 110. The supply pipe SP may include a plurality of supply lines SL1, SL2, SL3, SL4, and SL5. The plurality of supply lines SL1, SL2, SL3, SL4, and SL5 may include a first supply line SL1, a second supply line SL2, a third supply line SL3, a fourth supply line SL4, and a fifth supply line SL5. Here, the first to fifth supply lines SL1, SL2, SL3, SL4, and SL5 may be arranged in parallel. The plurality of supply lines SL1, SL2, SL3, SL4, and SL5 may supply the processing fluid PF to the upper portion of the processing container 110. The processing container 110 in the present disclosure may be a chamber in which a process, e.g., a drying process, is performed.

The processing fluid PF in the plurality of supply lines SL1, SL2, SL3, SL4, and SL5 may be heated to a specific/predetermined temperature. For example, the specific/predetermined temperature of the processing fluid PF may be controlled/maintained by the heater 360 and/or the heater of the storage tank 315. In some embodiments, the particular/predetermined temperature of the processing fluid PF may be between about 45° C. and about 150° C.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A plurality of valves V1, V2, V3, V4, and V5 for controlling the flow of the processing fluid PF may be installed in the plurality of supply lines SL1, SL2, SL3, SL4, and SL5. For example, a first valve V1 for controlling the flow of the processing fluid PF may be installed in the first supply line SL1, and a second valve V2 for controlling the flow of the processing fluid PF may be installed in the second supply line SL2. The first to fifth supply lines SL1, SL2, SL3, SL4, and SL5 may comprise or may be, for example, pipes.

In FIG. 2, the supply pipe SP of the substrate processing apparatus 1 includes five supply lines, but is not limited thereto. For example, the supply pipe SP may include four or less, or six or more supply lines. Although not shown, the first to fifth supply lines SL1, SL2, SL3, SL4, and SL5 may be connected to separate mass flow controllers. Further, at least one filter F may be arranged on one side of the first to fifth supply lines SL1, SL2, SL3, SL4, and SL5.

The inner diameters of the first to fifth supply lines SL1, SL2, SL3, SL4, and SL5 may be different from each other. Thus, the supply speed and/or amount (e.g., per minute) of the processing fluid PF supplied from the first to fifth supply lines SL1, SL2, SL3, SL4, and SL5 may be different from each other. For example, each of the first to fifth supply lines SL1, SL2, SL3, SL4, and SL5 may provide a corresponding flow rate different from flow rates of the other supply lines.

Figure 3:
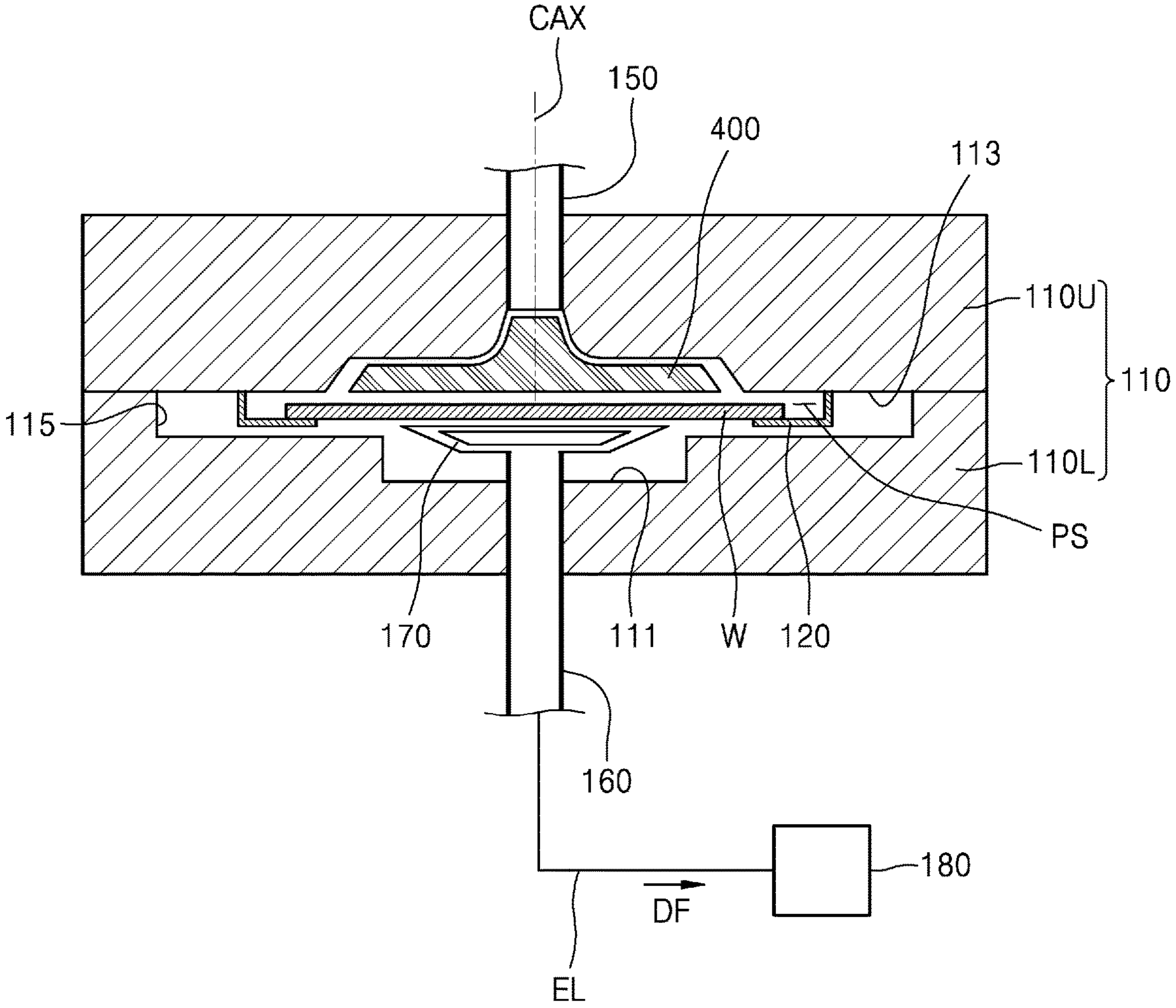
FIG. 3 is a cross-sectional view showing a substrate processing apparatus according to an embodiment.

FIG. 3 is a cross-sectional view showing a processing container and its vicinity of a substrate processing apparatus 1 according to an embodiment.

Referring to FIG. 3, the substrate processing apparatus 1 may include the processing container 110, the substrate support 120, the fluid supplier 130 of FIG. 1, a container supply pipe 150, a shower head assembly 400, an exhaust pipe 160, and an exhaust device 180.

The processing container 110 may provide processing space PS for processing a substrate W. The processing container 110 may seal/isolate the processing space PS from the outside while processing the substrate W. The processing space PS may be defined by a bottom surface 111, a top surface 113, and a side surface 115 of the processing container 110. For example, the processing space PS may be defined by a lower body 110L of the processing container 110 including the bottom surface 111 and the side surface 115 of the processing container 110 and an upper body 110U of the processing container 110 including the top surface 113 of the processing container 110. For example, the upper body 110U and the lower body 110L of the processing container 110 may encapsulate the processing space PS when a substrate is processed in the processing space PS. The inner wall of the processing container 110 may include an inclined surface inclined with respect to the top surface of the shower head assembly 400.

In some embodiments, the processing space PS may have a symmetrical shape with respect to a central axis CAX of the processing container 110. For example, the processing space PS may have a rotationally symmetric shape with respect to the central axis CAX of the processing container 110. For example, the processing container 110 and the processing space PS may have a symmetrical shape or a mirror shape with respect to any reference plane.

The processing container 110 may include the lower body 110L and the upper body 110U. The upper body 110U may be disposed above the lower body 110L. Each of the upper body 110U and the lower body 110L may include or be formed of, for example, metal material. For example, the upper body 110U may be coupled to the lower body 110L to cover a space provided by the lower body 110L. The upper body 110U and the lower body 110L may switch between a closed position of sealing the processing space PS and an open position of opening the processing space PS to the atmosphere outside the processing container 110.

In the closed position of the processing container 110, the upper body 110U may be coupled to the lower body 110L to seal/encapsulate the processing space PS. In the open position of the processing container 110, the upper body 110U may be spaced apart from the lower body 110L, and the processing space PS may be open to the atmosphere outside the processing container 110. Switching between the closed position and the open position of the processing container 110 may be implemented by a lifting device (e.g., a lift) configured to move the upper body 110U in a vertical direction (e.g., Z direction) with respect to the lower body 110L.

The substrate support 120 provided in the processing space PS may support the substrate W. The substrate support 120 may support the substrate W such that the top surface of the substrate W faces the top surface 113 of the processing container 110, and the bottom surface of the substrate W faces the bottom surface 111 of the processing container 110. The top surface of the substrate W may be a surface to be processed through the substrate processing apparatus 1. The substrate support 120 may support the substrate W so that the center of the top surface of the substrate W is aligned with (e.g., at a point of) the central axis CAX of the processing container 110.

The fluid supplier 130 may generate and supply the processing fluid PF for processing the substrate W, and may supply the generated processing fluid PF to the processing space PS of the processing container 110. In some embodiments, the fluid supplier 130 may be configured to generate and supply supercritical fluid, and the substrate processing apparatus 1 may be configured to process the substrate W using the supercritical fluid. For example, the substrate processing apparatus 1 may be configured to perform a drying process of the substrate W using the supercritical fluid.

Physical properties of the supercritical fluid, such as density, viscosity, diffusion coefficient, and polarity, may continuously change from a gas-like state to a liquid-like state depending on pressure change. The supercritical fluid, a material having a temperature equal to or higher than the critical temperature and a pressure equal to or higher than the critical pressure, may have gas-like diffusivity, viscosity, and surface tension, and may also have liquid-like solubility. When the drying process of the substrate W is performed using the supercritical fluid, the supercritical fluid having little surface tension may permeate into fine grooves provided in the substrate W, and cleaning liquid and/or rinsing liquid on the substrate W may be dried while the occurrence of leaning or water spots on the substrate W is suppressed.

For example, the supercritical fluid may include or be formed of carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), or a combination thereof. In some embodiments, the fluid supplier 130 may be configured to generate and supply the supercritical fluid comprising carbon dioxide. Since carbon dioxide has a low critical temperature of about 31° C. and a low critical pressure of about 73 bar and is non-toxic, non-flammable, and relatively inexpensive, it may be easily used for the drying process of the substrate W.

The fluid supplier 130 may be configured to supply the processing fluid PF to the processing space PS of the processing container 110 through the container supply pipe 150 positioned in the upper body 110L of the process container 110. The exhaust pipe 160 may extend within/through the lower body 110L of the processing container 110. The exhaust pipe 160 may extend downward from the bottom surface 111 of the processing container 110. For example, the exhaust pipe 160 may be inserted into a mounting hole of the lower body 110L of the processing container 110. The container supply pipe 150 may extend within/through the upper body 110U of the processing container 110. The container supply pipe 150 may extend upward from the top surface 113 of the processing container 110. For example, the container supply pipe 150 may be inserted into a mounting hole of the upper body 110U of the processing container 110.

The shower head assembly 400 may be positioned between (e.g., to vertically overlap) the top surface 113 of the processing container 110 and the substrate W, e.g., when the substrate W is positioned on the substrate support 120. The shower head assembly 400 may be spaced apart from the top surface 113 of the processing container 110. For example, a part of the inner wall of the processing container 110 opposite to and/or facing the shower head assembly 400 may be separated from the shower head assembly 400 so that a gap is formed between the shower head assembly 400 and the processing container 110, e.g., in a vertical direction and/or in a horizontal direction. The container supply pipe 150 may protrude downward from the upper body 110U of the processing container 110 toward the processing space PS. The container supply pipe 150 may be connected to the shower head assembly 400. The shower head assembly 400 may receive the processing fluid PF from the container supply pipe 150. The shower head assembly 400 may provide/diffuse the received processing fluid PF into the processing space PS.

The exhaust device 180 may be configured to discharge waste fluid DF in the processing space PS to the outside of the processing container 110. The exhaust device 180 may be connected to the exhaust pipe 160 located in the lower body 110L of the processing container 110 by an exhaust line EL. The exhaust device 180 may be configured to discharge the waste fluid DF in the processing space PS to the outside of the processing container 110 through the exhaust pipe 160. Here, the waste fluid DF may be a fluid including various gases, chemical solutions, byproducts, particles, processing fluid PF, and the like in the processing space PS. The waste fluid DF may be discharged from the processing space PS through the exhaust pipe 160.

The exhaust device 180 may include a vacuum pump, a recovery portion for recovering the waste fluid DF, an on-off valve 181 shown in FIG. 1 provided in the exhaust line EL, a flow meter provided in the exhaust line EL, etc. For example, the exhaust line EL may be a pipe. For example, for the exhaust operation by the exhaust device 180, the vacuum pump may reduce the pressure in the exhaust pipe 160 to suck the waste fluid DF in the processing space PS into the exhaust pipe 160.

Further, the exhaust device 180 may be configured to control the pressure in the processing space PS by sucking and removing the waste fluid DF from the processing space PS. The exhaust pipe 160 may extend through/within the lower body 110L of the processing container 110. The exhaust pipe 160 may extend downward from the bottom surface 111 of the processing container 110. Through the exhaust operation of the exhaust device 180, the waste fluid DF in the processing space PS may be sucked into the exhaust pipe 160. In some embodiments, the center of the exhaust pipe 160 may be aligned with (e.g., overlap) the central axis CAX of the processing container 110. For example, the center of the exhaust pipe 160 may be at the central axis CAX of the processing container 110.

Further, the container supply pipe 150 may overlap the exhaust pipe 160 vertically or in the vertical direction (e.g., Z direction). In plan view, the center of the container supply pipe 150 may be within the exhaust pipe 160. In some embodiments, the center of the exhaust pipe 160 and the center of the container supply pipe 150 may be aligned in the vertical direction (e.g., Z direction). In some embodiments, the center of the exhaust pipe 160 and the center of the container supply pipe 150 may be aligned with (e.g., be at) the central axis CAX of the processing container 110.

Figure 4:
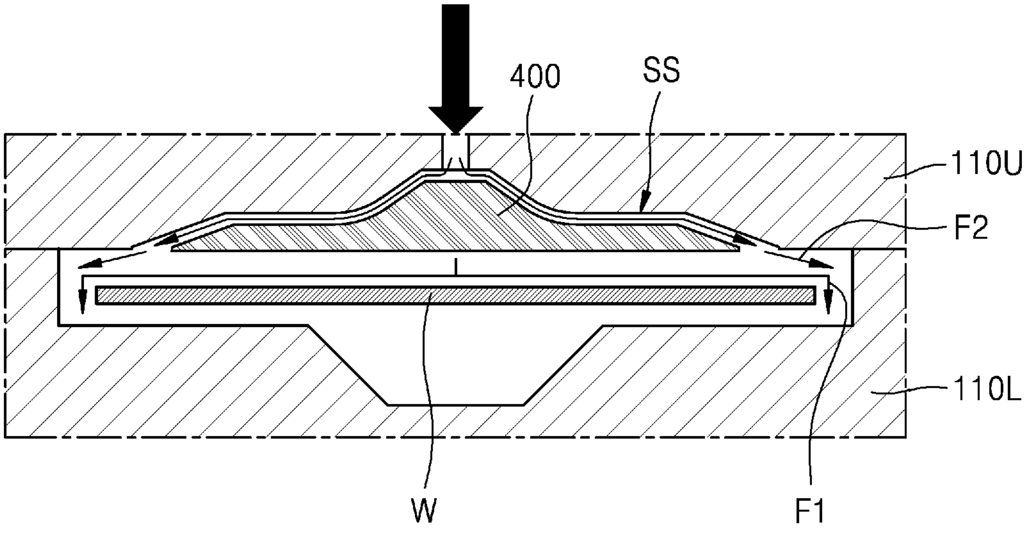
FIG. 4 is a plan view for explaining a substrate processing apparatus in more detail according to an embodiment.

FIG. 4 is a conceptual diagram illustrating the flow of fluid in the substrate processing apparatus according to an embodiment. Hereinafter, description will be made with reference to FIGS. 1 and 3, and contents already described in the description of FIGS. 1 to 3 will be briefly described or omitted.

Referring to FIGS. 3 and 4, the upper body 110U of the processing container 110 may be separated from the shower head assembly 400. For example, a separation space SS may be formed between the upper body 110U of the processing container 110 and the shower head assembly 400. The processing fluid PF may flow into the separation space SS. For example, a part of the processing fluid PF supplied from the container supply pipe 150 may be supplied to the processing space PS through the separation space SS without passing through the shower head assembly 400. The processing fluid PF may flow through the separation space SS toward the sidewall of the lower body 110L. Further, the processing fluid PF may flow through the shower head assembly 400, flow to and over the upper portion (e.g., upper surface) of the substrate W, and flow between the side surface of the substrate W and the lower body 110L.

Figure 5:
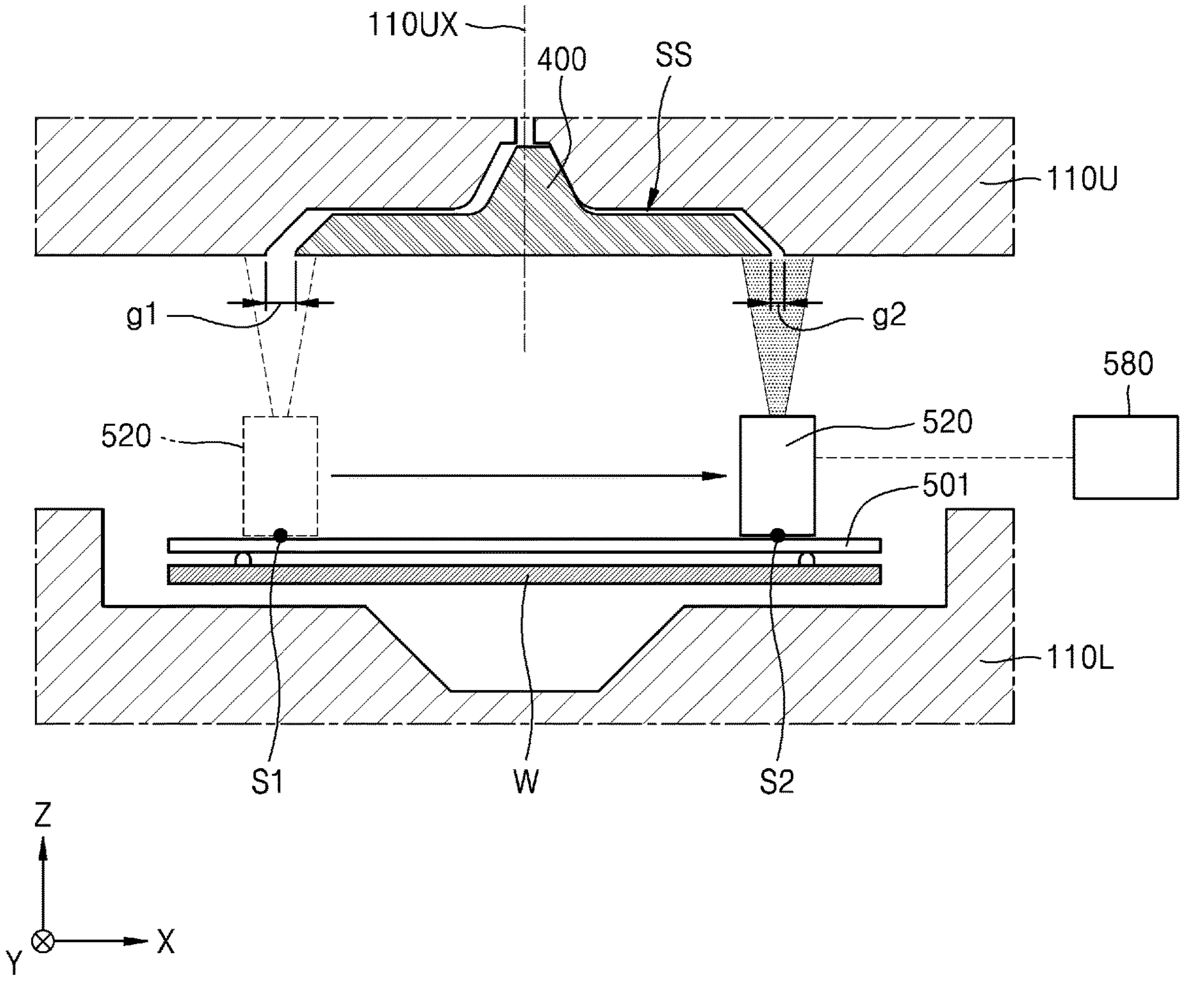
FIG. 5 is a cross-sectional view illustrating a first laser portion of the substrate processing apparatus of FIG. 1 according to an embodiment.
Figure 6:
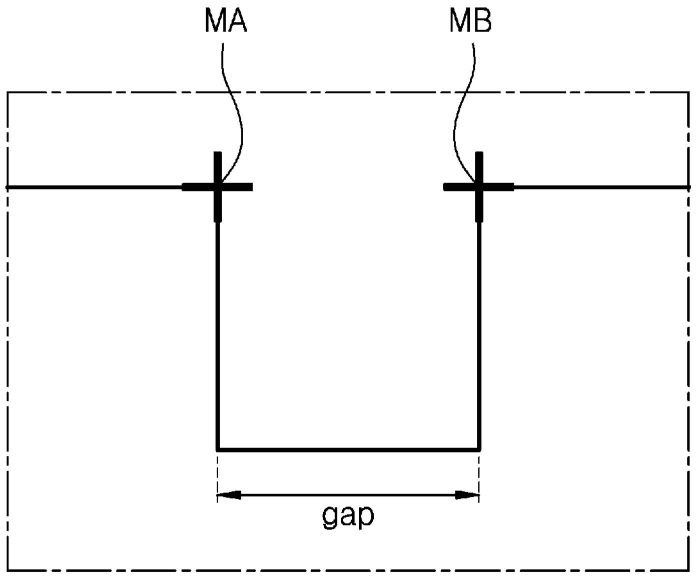
FIG. 6 is a diagram for explaining how the first laser portion of FIG. 5. measures a horizontal width.

FIG. 5 is a cross-sectional view illustrating a first laser portion 520 of the substrate processing apparatus of FIG. 1 according to an embodiment. FIG. 6 is a diagram for explaining a method of measuring the horizontal width of a passage/gap with the first laser portion of FIG. 5.

Referring to FIG. 5, the substrate processing apparatus 1 may include a jig 501 and a first laser portion 520.

The jig 501 may be disposed above the lower body 110L of the processing container 110. For example, the jig 501 may be coupled to the substrate W. For example, the jig 501 may be positioned above the substrate W. For example, the substrate W may support the jig 501 through one or more support units interposed between the substrate and the jig 501. For example, the jig 501 may have a circular plate shape and may be disposed parallel to the substrate W. For example, the jig 501 may be disposed above the substrate W such that a bottom surface of the jig 501 is parallel to a top surface of the substrate W with the support units interposed therebetween. The jig 501 may include a plurality of fasteners S1 and S2. The plurality of fasteners S1 and S2 may be disposed on the top surface of the jig 501. The first laser portion 520 may be coupled to the plurality of fasteners S1 and S2. The plurality of fasteners S1 and S2 may include a first fastener S1 and a second fastener S2. The jig 501 is illustrated as including the first fastener S1 and the second fastener S2, but is not limited thereto, and may include more fasteners.

The first laser portion 520 may measure the horizontal alignment between the lower body 110L of the processing container 110 and the shower head assembly 400. The first laser portion 520 may be coupled to the first fastener S1 or the second fastener S2, and may contact the jig 501. The first laser portion may be spaced apart from the substrate W with the jig 501 positioned therebetween. The processing container 110 may include a passage formed by separating the processing container 110 and the shower head assembly 400. The first laser portion 520 may emit a first laser beam toward the passage. The first laser portion 520 may measure a horizontal width of the passage using the first laser beam. The first laser portion 520 may transmit the measured horizontal width of the passage to the controller 580. Each of laser portions disclosed in the present application may be a laser device or a laser component which includes a laser emitting part and/or a light sensing part, e.g., which receives a laser light reflected from an object.

The first laser portion 520 may emit the first laser beam at/from a plurality of points on the jig 501 (e.g., point of the first fastener S1 or the second fastener S2). The first laser portion 520 may measure the horizontal width of the passage at at least three different points/places of the passage.

In some embodiments, the first laser portion 520 may measure a first horizontal width g1 while the first laser portion 520 is disposed on/at the first fastener S1. For example, the first fastener S1 and/or the first laser portion 520 may be positioned at a place vertically overlapping an end of the passage while the first laser portion 520 measures the first horizontal width g1. Further, the first laser portion 520 may measure a second horizontal width g2 while the first laser portion 520 is disposed on/at the second fastener S2. For example, the second fastener S2 and/or the first laser portion 520 may be positioned at a place vertically overlapping an end of the passage while the first laser portion 520 measures the second horizontal width g2. When the second horizontal width g2 is narrower than the first horizontal width g1, the controller 580 may horizontally move the shower head assembly 400, e.g., to adjust the horizontal widths. For example, the controller 580 may move the shower head assembly 400 to the left. The controller 580 may move the shower head assembly 400 such that the first horizontal width g1 is equal to the second horizontal width g2.

In some embodiments, the first laser portion 520 coupled to a third fastener (not shown) may measure a third horizontal width (not shown) of the passage while the first laser portion 520 is disposed on/at the third fastener. For example, the third fastener and/or the first laser portion 520 may be positioned at a place vertically overlapping an end of the passage while the first laser portion 520 measures the third horizontal width. Here, the controller 580 may horizontally move the shower head assembly 400 based on the first horizontal width g1, the second horizontal width g2, and the third horizontal width. For example, the controller 580 may horizontally move the shower head assembly 400 such that the first horizontal width g1, the second horizontal width G2, and the third horizontal width are the same.

Referring to FIG. 6, horizontal solid lines represent the first laser beam emitted from the first laser portion 520. The emitted first laser beam may appear in the form of a line on the shower head assembly 400 and the upper body 110U. The first laser portion 520 may recognize a lower edge MA of the shower head assembly 400 and a lower edge MB of the upper body 110U. The first laser portion 520 may measure a horizontal width of the gap between the lower edge MA of the shower head assembly 400 and the lower edge MB of the upper body 110U.

Figure 7:
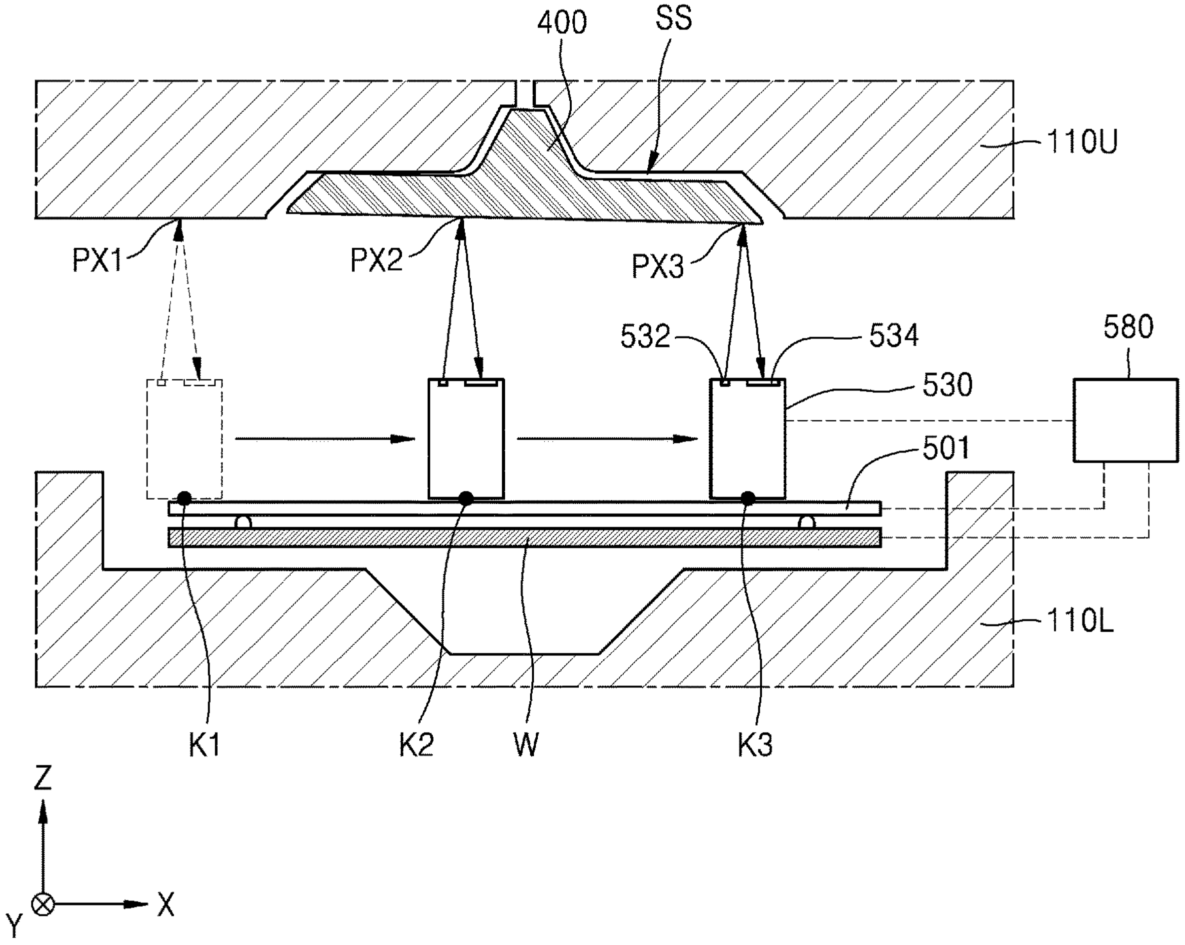
FIG. 7 is a cross-sectional view illustrating a second laser portion of the substrate processing apparatus of FIG. 1 according to some embodiments.
Figure 8:
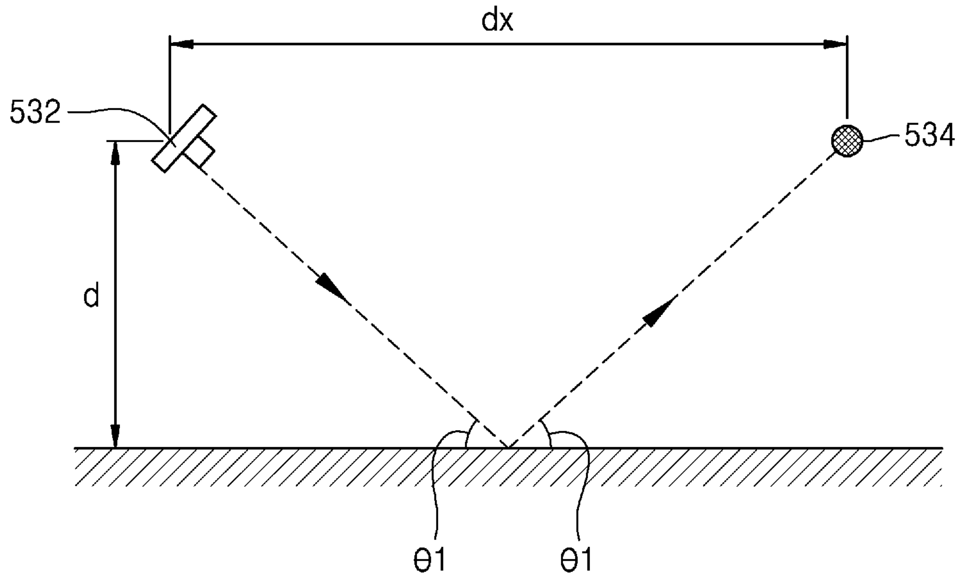
FIG. 8 is a diagram for explaining how the second laser portion of FIG. 7 measures a vertical distance.

FIG. 7 is a cross-sectional view illustrating a second laser portion of the substrate processing apparatus of FIG. 1 according to some embodiments. FIG. 8 is a diagram for explaining how the second laser portion of FIG. 7 measures a vertical distance.

Referring to FIG. 7, the substrate processing apparatus 1 may include a second laser portion 530. The second laser portion 530 may include a light emitting portion 532 and a light receiving portion 534. The second laser portion 530 may emit a second laser beam through/from the light emitting portion 532. The second laser portion 530 may receive the second laser beam reflected from the object through the light receiving portion 534.

The second laser portion 530 may measure a vertical distance from a top surface of the second laser portion 530 to one of the upper body 110U of the processing container 110 and the shower head assembly 400 from three or more points (e.g., at least three points of a plurality of fasteners K1, K2 and K3) on the jig 501. The second laser portion 530 may be coupled to the plurality of fasteners K1, K2, and K3 of the jig 501. The plurality of fasteners K1, K2, and K3 may include a first fastener K1, a second fastener K2, and a third fastener K3.

In some embodiments, the second laser portion 530 may be coupled to the first fastener K1. For example, the second laser portion 530 may emit the second laser beam toward the bottom surface of the upper body 110U of the processing container 110 and receive the second laser beam reflected from the bottom surface of the upper body 110U. In some embodiments, the second laser portion 530 coupled to the second fastener K2 may emit the second laser beam toward the bottom surface of the shower head assembly 400, and receive the second laser beam reflected from the bottom face of the shower head assembly 400.

The second laser portion 530 coupled to the first fastener K1 may measure a distance from a top surface of the second laser portion 530 to a first point PX1 of the upper body 110U. The second laser portion 530 coupled to the second fastener K2 may measure a distance from a top surface of the second laser portion 530 to a second point PX2 of the upper body 110U. The second laser portion 530 coupled to the third fastener K3 may measure a distance from a top surface of the second laser portion 530 to a third point PX3 of the upper body 110U.

In some embodiments, the first fastener K1, the second fastener K2, and the third fastener K3 may all be disposed below (e.g., to vertically overlap) the upper body 110U. For example, the second laser portion 530 may measure vertical distances from a top surface of the second laser portion 530 to the upper body 110U at at least three points. Thus, the controller 580 may calculate an inclination of the upper body 110U based on the vertical distances at three different points. Here, the inclination of the upper body 110U may be the degree to which the upper body 110U is inclined with respect to the substrate W. The controller 580 may also calculate a vertical level of the upper body 110U based on the vertical distances measure from the second laser portion 530.

In some embodiments, the first fastener K1, the second fastener K2 and the third fastener K3 may all be disposed below (e.g., to vertically overlap) the shower head assembly 400. For example, the second laser portion 530 may measure vertical distances from a top surface of the second laser portion 530 to the shower head assembly 400 at at least three points. Thus, the controller 580 may calculate the inclination of the shower head assembly 400 based on the vertical distances at three different points. Here, the inclination of the shower head assembly 400 may be the degree to which the shower head assembly 400 is inclined with respect to the substrate W. For example, the second laser portion 530 may measure vertical alignments of the shower head assemble 400 and/or the upper body 110U in combination with other second laser portions 530 and the controller 580. For example, the second laser portion 530 may measure vertical alignments between the shower head assemble 400 and the upper body 110U in combination with other second laser portions 530 and the controller 580.

Referring to FIG. 8, the second laser portion 530 may calculate a vertical distance d based on a distance dx between the light emitting portion 532 and the light receiving portion 534 and an angle θ1 formed between the second laser beam and the object.

Figure 9:
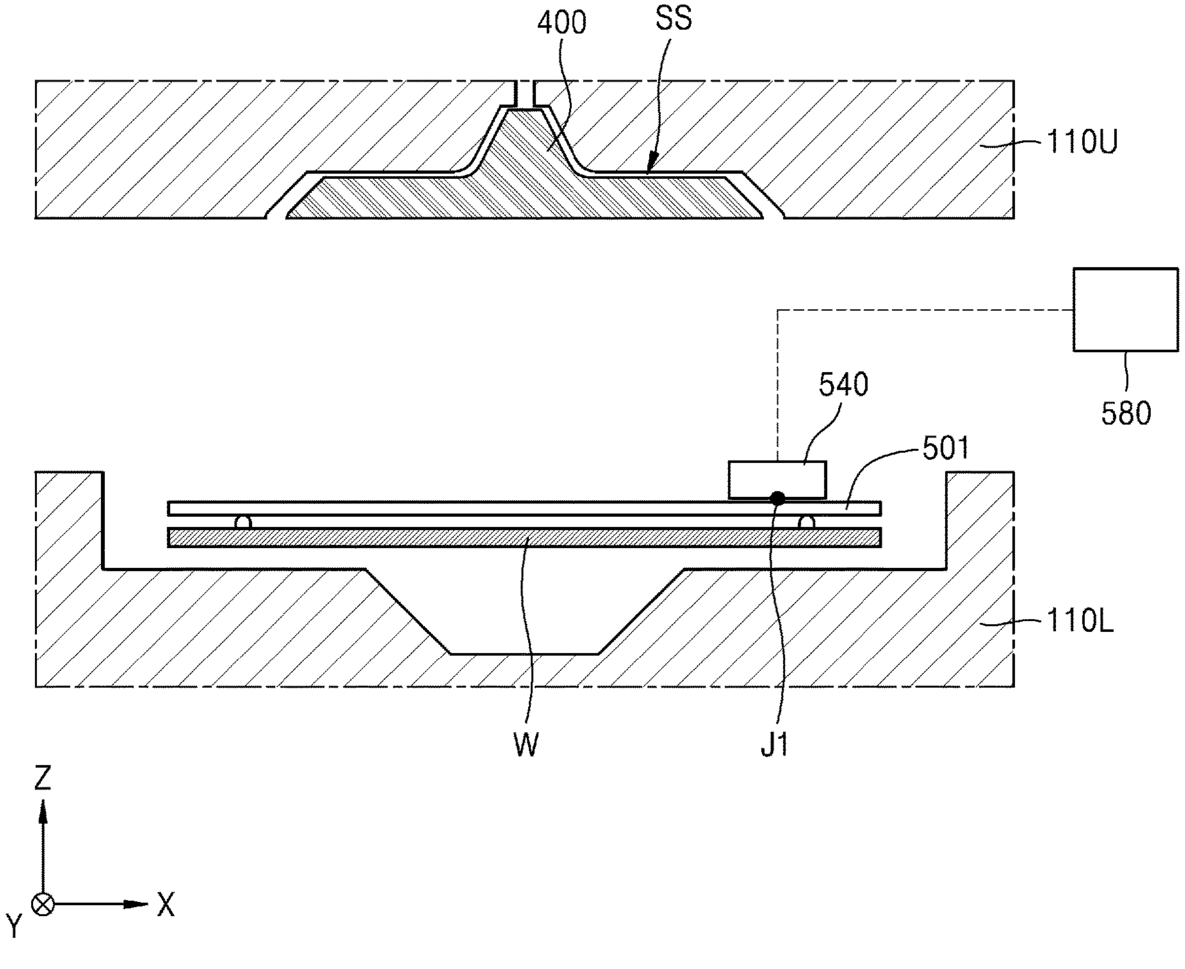
FIG. 9 is a cross-sectional view illustrating a gyro sensor of the substrate processing apparatus of FIG. 1 according to some embodiments.

FIG. 9 is a cross-sectional view illustrating a gyro sensor 540 of the substrate processing apparatus of FIG. 1 according to some embodiments.

Referring to FIG. 9, the substrate processing apparatus 1 may include the gyro sensor 540. The gyro sensor 540 may measure the equilibrium of the substrate W and the lower body 110L of the processing container 110. For example, the gyro sensor 540 may measure vibrations and/or rotations of the substrate W and the lower body 110L of the processing container 110. The gyro sensor 540 may measure other movements and/or directions (e.g., level/balance/inclination) of the substrate W and the lower body 110L of the processing container 110. The gyro sensor 540 may be mounted on the fastener J1 of the jig 501. The gyro sensor 540 may be positioned between the upper body 110U of the processing container 110 and the lower body 110L of the processing container 110. The gyro sensor 540 may be a gyroscope or a horizontal indicator, but is not limited thereto. The gyro sensor 540 may include a sensor capable of measuring the equilibrium of the substrate W.

Figure 10:
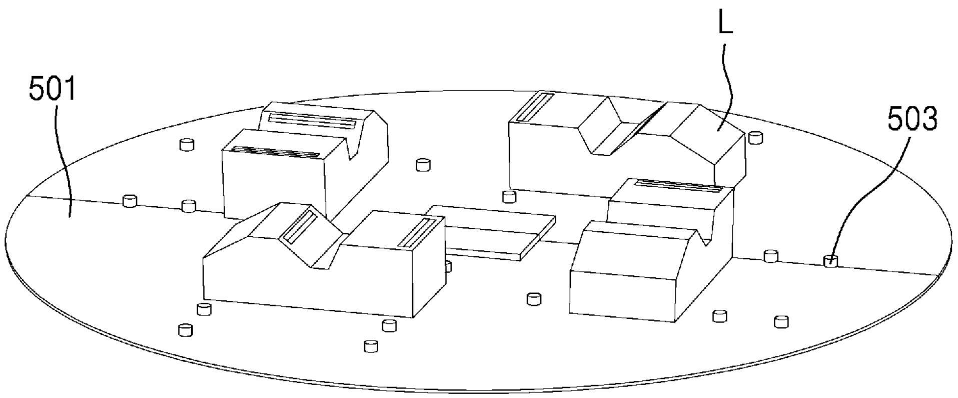
FIGS. 10 and 11 are perspective views showing jigs of a substrate processing apparatus according to some embodiments.
Figure 11:
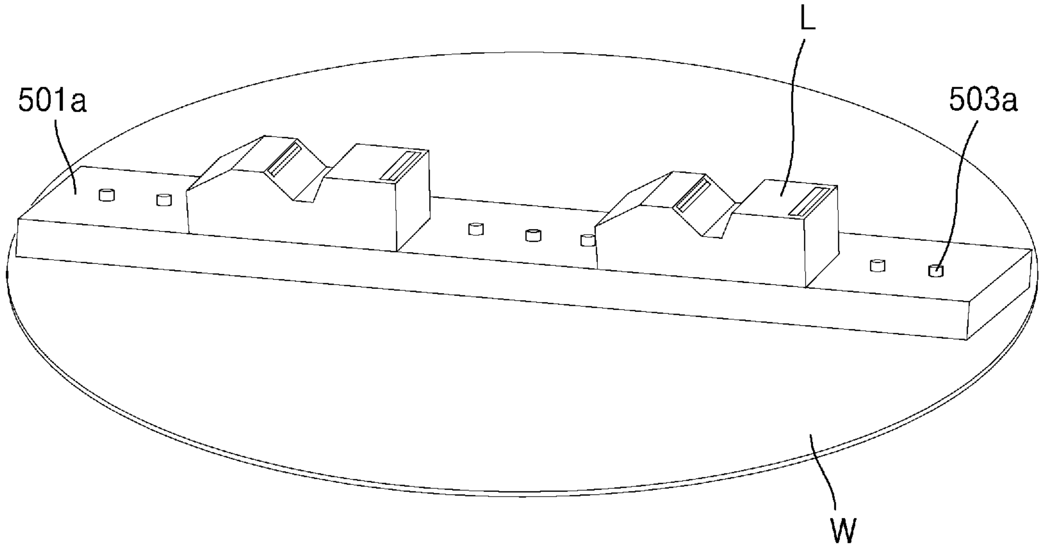

FIGS. 10 and 11 are perspective views illustrating jigs of the substrate processing apparatus 1 according to some embodiments.

Referring to FIG. 10, the jig 501 may have a disc shape. The laser portions L may be disposed on the jig 501. Further, the laser portions L may be in contact with the top surface of the jig 501. The diameter of the jig 501 may be the same as that of the substrate W. The plurality of fasteners 503 may be disposed on the top surface of the jig 501. The plurality of fasteners 503 may be arranged from the center of the jig 501 to the edge of the jig 501.

Referring to FIG. 11, the jig 501*a* may have a bar shape. The jig 501*a* may be mounted on the substrate W. The jig 501*a* may include the plurality of fasteners 503*a* arranged in a line therein. The laser portions L may be arranged in a line on the jig 501*a* in the extension direction (e.g., in a lengthwise direction) of the jig 501*a*. The jig 501*a* is shown as being disposed horizontally (e.g., extending in a horizontal direction) on the wafer, but may be rotated on the same plane.

Figure 12:
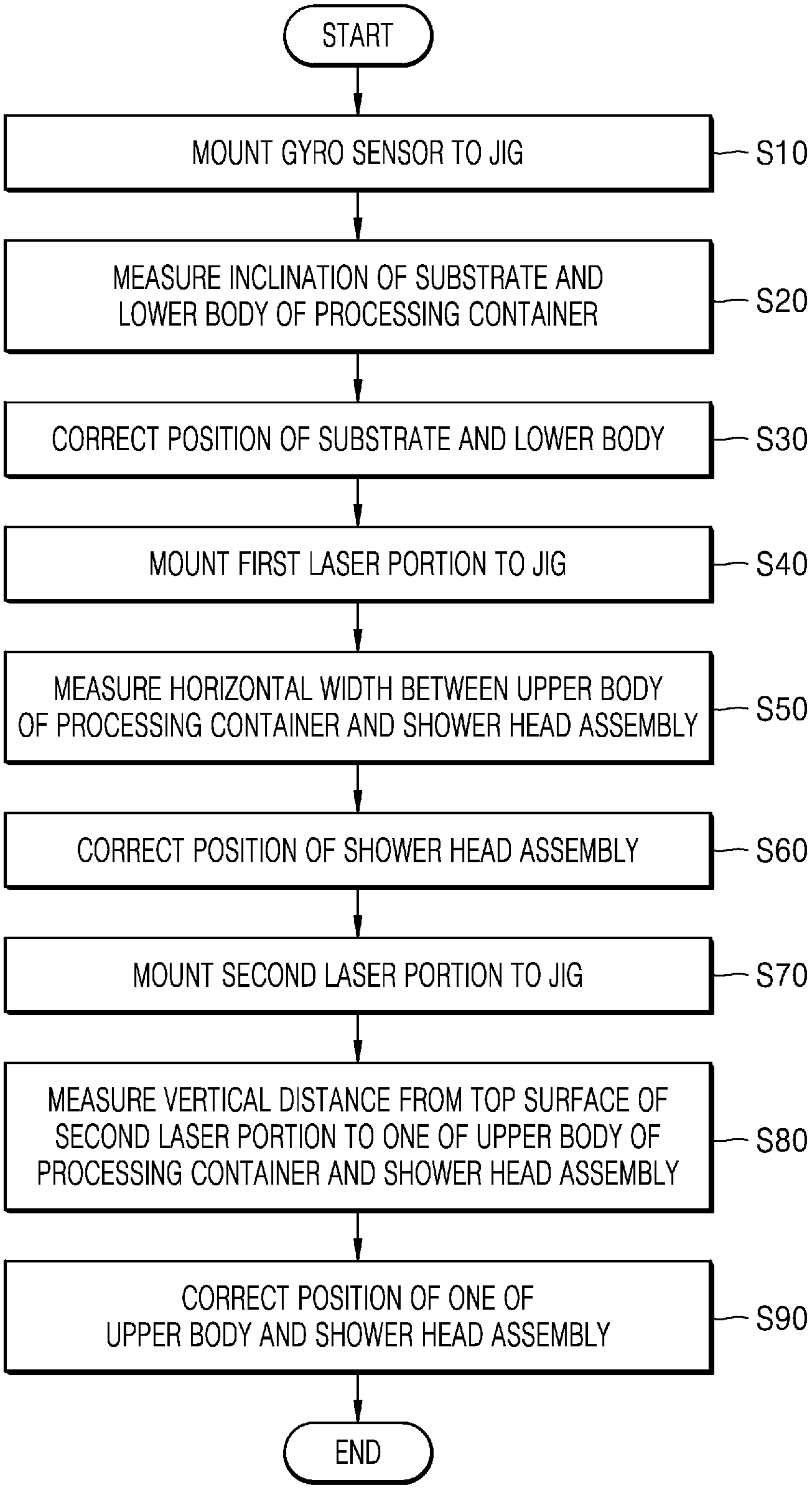
FIG. 12 is a flowchart for explaining a substrate processing method according to an embodiment.

FIG. 12 is a flowchart for explaining a substrate processing method according to an embodiment. Description will be made with reference to FIGS. 3 to 9, and contents already described in the description of FIGS. 1 to 9 will be briefly described or omitted.

Referring to FIGS. 9 and 12, in the substrate processing method, the gyro sensor 540 may be mounted on the jig 501 first (S10). Prior to S10, the upper body 110U may be spaced apart from the lower body 110L of the processing container 110 and the jig 501 may be coupled onto the substrate W. The gyro sensor 540 may be coupled to the fastener J1 of the jig 501 and may be in contact with the jig 501.

After the gyro sensor 540 is mounted, the equilibrium of the substrate W and the lower body portion 110L of the processing container 110 may be measured using the gyro sensor 540 (S20). The gyro sensor 540 may transmit the measured equilibrium to the controller 580. The equilibrium may be a state of balance of the substrate W and the lower body 110L of the processing container 110. For example, the measurement of the equilibrium of the substrate W and the lower body 110L may include a measurement of inclination of the substrate W and/or the lower body 110L.

After measuring the equilibrium including a degree of level/balance and/or inclination, the position/inclination of the lower body 110L may be corrected based on the degree of level/balance and/or the inclination of the lower body 110L (S30). For example, based on the measured degree of level/balance and/or inclination, the controller 580 may correct the inclination of one of the substrate support 120 of the substrate W and the lower body 110L, e.g., for the top surface of the substrate W to be at a leveled/horizontal position. For example, the correcting of the inclination/position of the lower body 110L and/or the substrate W may include moving the lower body 110L and/or the substrate support 120 in a vertical direction and/or in a horizontal direction. Thereafter, the gyro sensor 540 may be removed or detached from the jig 501.

Referring to FIGS. 5 and 12, the first laser portion 520 may then be mounted on the jig 501 (S40). The first laser portion 520 may be fastened to at least three fasteners. The first laser portion 520 fastened to the fasteners may come into contact with the jig 501.

After the first laser portion 520 is mounted, a horizontal width between the upper body 110U of the processing container 110 and the shower head assembly 400 may be measured using the first laser portion 520 (S50). The horizontal width may include or may be a width of the separation space, e.g., a distance, between the upper body 110U and the shower head assembly 400. Further, the horizontal width may be a horizontal width of the passage formed between the upper body 110U and the shower head assembly 400. For example, the horizontal width may include one of the first horizontal width g1 and the second horizontal width g2. The first laser portion 520 mounted on the jig 501 at at least three points may measure the horizontal width of the passage at at least three points.

After measuring the horizontal width, the controller 580 may correct the position of the shower head assembly 400 based on the horizontal width (S60). For example, the shower head assembly 400 may be moved horizontally at the same vertical level (while maintaining the vertical level of the shower head assembly 400). Thus, the controller 580 may align the central axis of the shower head assembly 400 with the central axis 110UX of the upper body 110U by moving the position of the shower head assembly 400. For example, the controller 580 may move the shower head assembly 400 such that the central axis of the shower head assembly 400 and the central axis 110UX of the upper body 110U coincide. Thereafter, the first laser portion 520 may be removed and detached from the jig 501.

Referring to FIGS. 7 and 12, the second laser portion 530 may be mounted on the jig 501 (S70). The second laser portion 530 may be mounted on any one of the plurality of fasteners K1, K2, K3 on the jig 501. In some embodiments, the second laser portion 530 may be coupled to at least three fasteners on the jig 501. In some embodiments, the at least three fasteners may all be disposed vertically below (e.g., vertically overlap) the upper body 110U of the processing container 110. In some embodiments, the at least three fasteners may all be disposed vertically below (e.g., vertically overlap) the shower head assembly 400. In some embodiments, one of the at least three fasteners may be disposed vertically below (e.g., vertically overlap) the upper body 110U of the processing container 110, and another one of the at least three fasteners may be disposed vertically below (e.g., vertically overlap) the shower head assembly 400.

Next, a vertical distance from the top surface of the second laser portion 530 to one of the upper body 110U of the processing container 110 and the shower head assembly 400 may be measured using the second laser portion 530. The second laser portion 530 may emit the second laser beam to different positions depending on the positions of the coupled fasteners. For example, when the second laser portion 530 is fastened to the first fastener K1, the second laser portion 530 may emit the second laser beam to the upper body 110U of the processing container 110. When the second laser portion 530 is fastened to the second fastener K2, the second laser portion 530 may emit the second laser beam to the shower head assembly 400.

In some embodiments, the second laser portion 530 may measure the vertical distances to at least three points on the bottom surface of the upper body 110U of the processing container 110. In some embodiments, the second laser portion 530 may measure the vertical distances to at least three points on the bottom surface of the shower head assembly 400.

After measuring the vertical distances, the controller 580 may correct the position of one of the upper body 110U of the processing container 110 and the shower head assembly 400 based on the vertical distances (S90). The controller 580 may collect at least three vertical distances and correct the position of one of the upper body 110U of the processing container 110 and the shower head assembly 400.

In some embodiments, when the controller 580 collects three vertical distances of the upper body 110U, the controller 580 may calculate the inclination of the upper body 110U. When it is determined that the upper body 110L is inclined, the controller 580 may rotate the upper body 110U so that the upper body 110L faces (e.g., is parallel to) the substrate W. The controller 580 may correct the position of the shower head assembly 400 in the same manner as described above.

Figure 13:
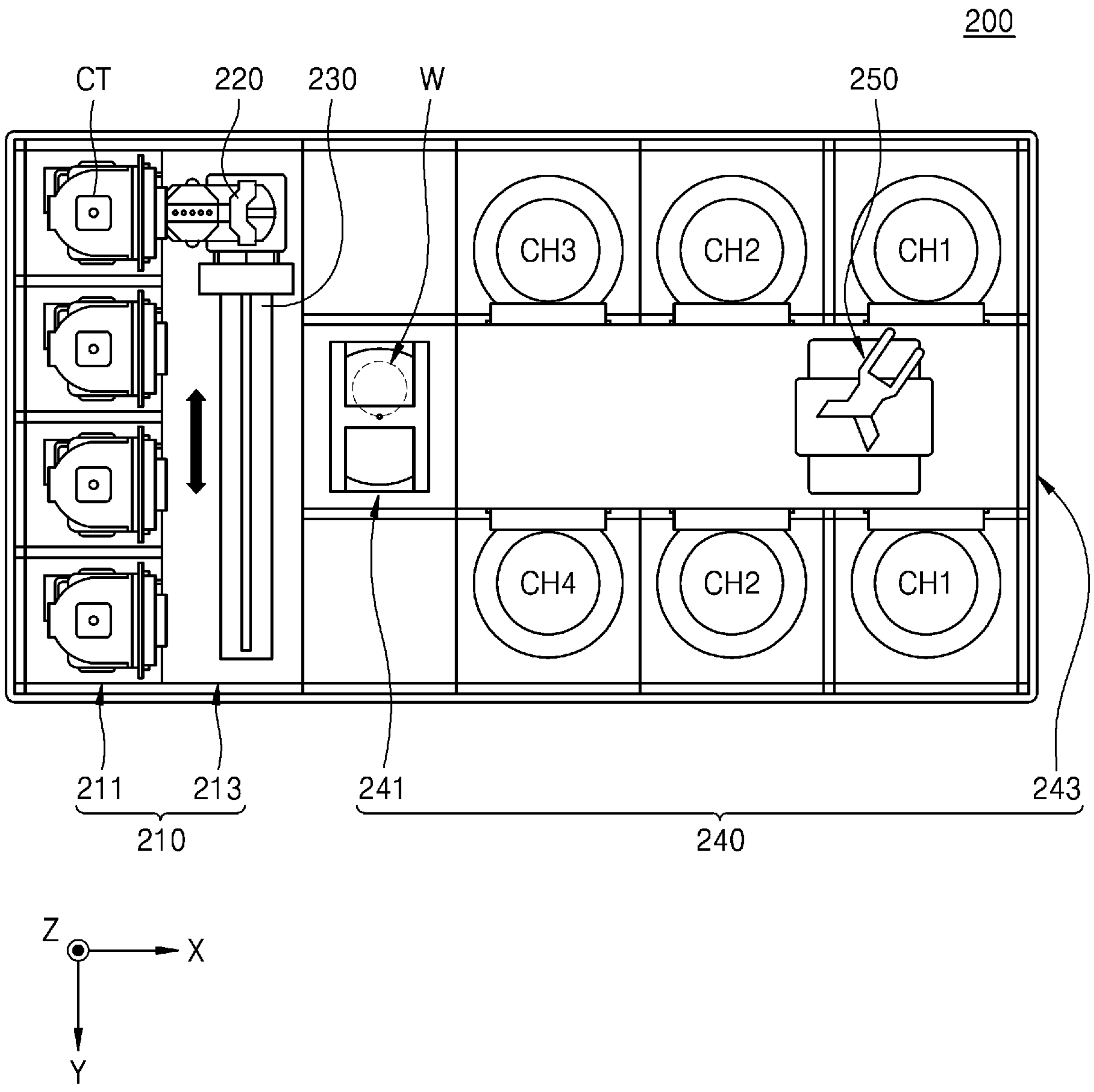
FIG. 13 is a plan view showing a substrate processing apparatus according to some embodiments.

FIG. 13 is a cross-sectional view illustrating a substrate processing apparatus 200 according to some embodiments.

Referring to FIG. 13, the substrate processing apparatus 200 may include an index module 210, a processing module 240, and a substrate transfer unit 250.

The index module 210 may include load ports 211 and a transfer frame 213. The load ports 211, the transfer frame 213, and the processing module 240 may be sequentially arranged in a line. Hereinafter, a direction in which the load ports 211, the transfer frame 213, and the processing module 240 are arranged in a row is defined as the X direction, a horizontal direction perpendicular to the X direction is defined as the Y direction, and a direction perpendicular to each of the X direction and the Y direction is defined as the Z direction.

The containers CT each accommodating substrates W are placed on the load ports 211. The load ports 211 of which the number is plural may be arranged in a line in the Y direction. Although four load ports 211 are shown in FIG. 13, the number of load ports 211 may increase or decrease depending on conditions such as process efficiency and/or installation area of the processing module 240. Each of the containers CT may include a plurality of slots for supporting the edges of the substrates W. The plurality of slots may be spaced apart from each other in the Z direction, and thus, the plurality of substrates W are mounted in the containers CT in the Z direction. The containers CT may be, for example, front opening unified pods (FOUP).

The transfer frame 213 may transport the substrate W between the container CT on the load port 211 and the buffer chamber 241 of the processing module 240. The transfer frame 213 may include an index robot 220 and an index rail 230. The index rail 230 may extend in the Y direction. The index robot 220 installed on the index rail 230 may linearly move along the index rail 230 in the Y direction.

The processing module 240 may include a buffer chamber 241, a transfer chamber 243, and first to fourth process chambers CH1, CH2, CH3, and CH4. The transfer chamber 243 may extend in the X direction. In some embodiments, the first to fourth process chambers CH1, CH2, CH3, and CH4 may be spaced apart in the Y direction with the transfer chamber 243 therebetween. Further, the first to fourth process chambers CH1, CH2, CH3, and CH4 may be arranged in the X direction. In some embodiments, some of the first to fourth process chambers CH1, CH2, CH3, and CH4 may be stacked in the Z direction.

The exemplary arrangement of the first to fourth process chambers CH1, CH2, CH3, and CH4 is shown, and the first to fourth process chambers CH1, CH2, CH3, and CH4 may be arranged in various ways, if necessary. For example, all of the first to fourth process chambers CH1, CH2, CH3, and CH4 may be arranged on only one side of the transfer chamber 243.

The buffer chamber 241 may be disposed between the transfer frame 213 and the transfer chamber 243. The buffer chamber 241 may be positioned between the transfer frame 213 and the transfer chamber 243. The buffer chamber 241 may include a plurality of slots, which are internal spaces in which the substrate W is stored. The plurality of slots may overlap and be spaced apart from each other in the Z direction. The buffer chamber 241 may include an opening through which the substrate W may come in and out on each of a surface facing the transfer frame 213 and a surface facing the transfer chamber 243.

The transfer chamber 243 may transfer the substrate W between the buffer chamber 241 and the first to fourth process chambers CH1, CH2, CH3, and CH4. The substrate transfer unit 250 may be located in the transfer chamber 243. The substrate transfer unit 250 may be provided on a rail extending in the X direction, and may move along the rail in the X direction. The substrate W may be transferred by the substrate transfer unit 250 between the first to fourth process chambers CH1, CH2, CH3, and CH4.

The first to fourth process chambers CH1, CH2, CH3, and CH4 may sequentially perform processing on one substrate W. For example, after a developing process is performed on the substrate W in the first process chambers CH1, a drying process may be performed on the substrate W in the second process chambers CH2. Here, the developing process is a process of removing the photoresist at the portion exposed (or not exposed) to the extreme ultraviolet (EUV) light during an exposure process. The drying process may be carried out with processing fluid in a supercritical state. In some embodiments, the processing fluid in a supercritical state may comprise or be formed of carbon dioxide (CO2).

The first process chambers CH1 may supply a developing solution to the substrate W in a dry state using a spraying device. The developing solution may be, for example, a nonpolar organic solvent. The developing solution may be a liquid capable of selectively removing soluble regions of the photoresist for EUV. For example, due to the developing solution in the first process chambers CH1, the substrate W in a dry state may become a substrate W in a wet state. The plurality of first process chambers CH1 may be arranged in the processing module 240, and the number of the first process chambers CH1 may change depending on conditions such as process efficiency and/or installation area of the processing module 240.

The second process chambers CH2 may receive the substrate W in a wet state from the first process chambers CH1 and remove the developing solution from the received substrate W by using supercritical fluid. Conventionally, a method of rotating the substrate W at high speed has been used, but during high-speed rotation, the photoresist pattern for EUV may collapse due to surface tension.

In order to solve this problem, the developing solution may be removed by dissolving the developing solution in the supercritical fluid and then discharging the supercritical fluid. By removing both the developing solution and the supercritical fluid from the substrate W in this manner, the substrate W in a wet state may be dried. For example, due to the drying process in the second process chambers CH2, the wet substrate W may become a dry substrate W. The plurality of second process chambers CH2 may be arranged in the processing module 240, and the number of the second process chambers CH2 may change depending on conditions such as process efficiency and/or installation area of the processing module 240. In some embodiments, the second process chambers CH2 may correspond to the substrate processing apparatus 1 described with reference to FIGS. 1 to 11.

The third process chamber CH3 may receive the substrate W from the second process chambers H2 and perform a baking process to completely dry the substrate W. The substrate W on a hot plate in the third process chamber CH3 may be baked at a temperature of about 120° C. to about 170° C. for about 30 seconds to about 120 seconds. For example, due to the baking process in the third process chamber CH3, the substrate W may be maintained in a dry state.

The fourth process chamber CH4 may receive the substrate W from the third process chamber CH3 and perform a cooling process to lower the temperature of the substrate W. The cooling process may be performed on a cooling plate in the fourth process chamber CH4. For example, due to the cooling process in the fourth process chamber CH4, the substrate W may remain in a dry state.

Figure 14:
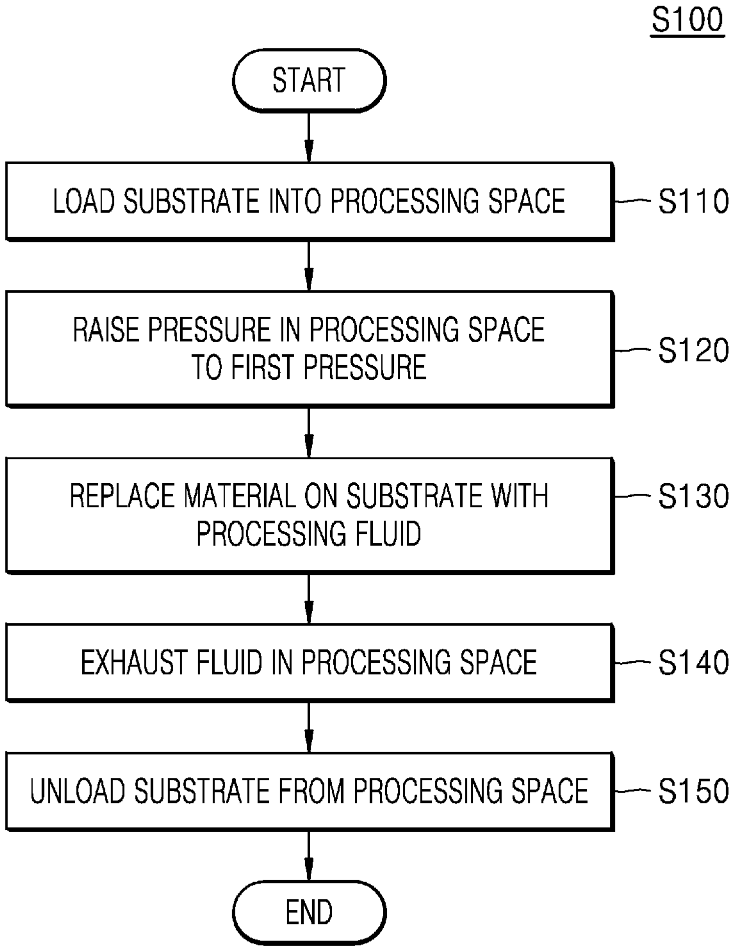
FIG. 14 is a flowchart for explaining a substrate processing method according to some embodiments.
Figure 15:
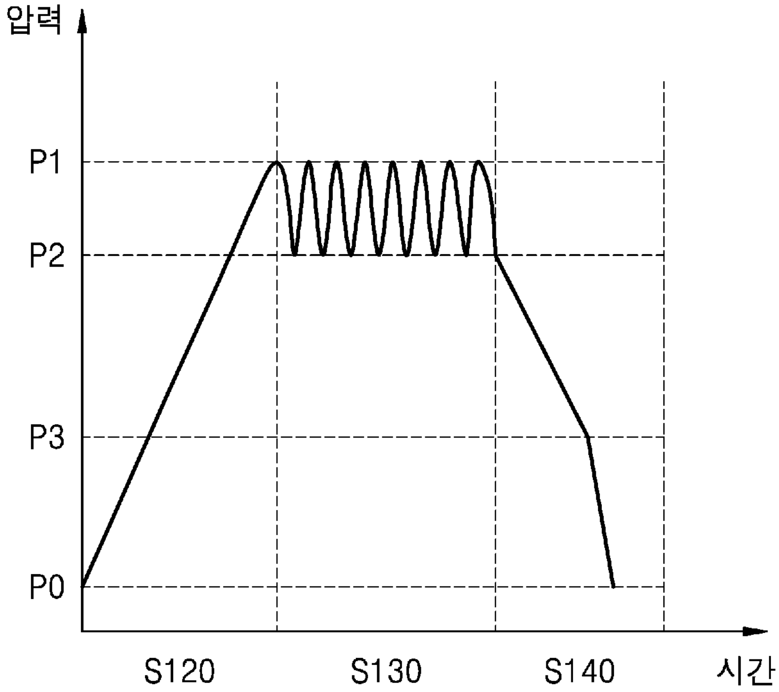
FIG. 15 is a graph showing pressure changes in a processing space during a substrate processing.

FIG. 14 is a flowchart for explaining a substrate processing method according to some embodiments. FIG. 15 is a graph showing the pressure in processing space during substrate processing.

Hereinafter, an exemplary substrate drying method (S100) using the substrate processing apparatus 1 described with reference to FIGS. 1 to 3 will be described.

First, the substrate W is loaded into the processing space PS of the processing container 110 (S110). While the substrate W is loaded into the processing space PS, the processing container 110 may be located at an open position. The substrate W may be placed on the substrate support 120. When the substrate W is loaded onto the substrate support 120, the processing container 110 may switch from an open position to a closed position so that the processing space PS is sealed/isolated from the outside of the processing container 110.

When loading the substrate W is completed, a drying process is performed on the substrate W. The drying process of the substrate W may include increasing the pressure in the processing space PS to a target pressure (S120), replacing the material on the substrate W with the processing fluid PF (S130), and discharging the waste fluid DF from the processing space PS (S140).

S120 may include supplying the processing fluid PF in a supercritical state to the processing space PS to fill the processing space PS with the supercritical fluid. In some embodiments, the fluid supplier 130 may supply the processing fluid PF in a supercritical state to the processing space PS, and increase the pressure in the processing space PS from the initial pressure P0 similar to the atmospheric pressure to the first pressure P1. In some embodiments, the first pressure P1 may be higher than the critical pressure of the processing fluid PF, and may be, for example, about 150 bar.

In some embodiments, S120 may include a first supply process of supplying the processing fluid PF in the first temperature to the lower portion of the processing space PS through a first supply line SL1 and a second supply process of supplying the processing fluid PF in the second temperature to the upper portion of the processing space PS through a second supply line SL2. In the first supply process, the first temperature of the processing fluid PF may be between about 35° C. and about 70° C. In the second supply process, the second temperature of the processing fluid PF may be higher than the first temperature. In the second supply process, the second temperature of the processing fluid PF may be between about 70° C. and about 120° C. The first supply process may be performed until the pressure in the processing space PS reaches a target intermediate pressure between the initial pressure P0 and the first pressure P1, and the target intermediate pressure may be, for example, between about 75 bar and about 90 bar. When the pressure in the processing space PS reaches the target intermediate pressure during the first supply process, the second supply process may start. The second supply process may be performed until the pressure in the processing space PS reaches the first pressure P1.

In S130, material (e.g., developing solution and/or rinsing solution) on the substrate W may be mixed (or substituted) with the processing fluid PF, and the mixed fluid may be discharged through the exhaust pipe 160.

S130 may include a pressure reduction process of reducing the pressure in the processing space PS from the first pressure P1 to a second pressure P2 lower than the first pressure P1, and a pressure boost process of raising the pressure in the processing space PS from a second pressure P2 to the first pressure P1. The second pressure P2 may be between about 75 bar and about 90 bar. S130 may include repeating the pressure reduction process and the pressure boost process alternately at least two or more times. For example, step S130 may include repeating both of the pressure reduction process and the pressure boost process two or more times after the pressure initially reaches the first pressure P1. The pressure reduction process may include exhausting the waste fluid DF from the processing space PS through the exhaust device 180. The pressure boost process may include supplying the processing fluid PF in the second temperature to the upper portion of the processing space PS through the second supply pipe 150.

In S140, the exhaust device 180 may exhaust the waste fluid DF from the processing space PS to reduce the pressure in the processing space PS to the initial pressure P0. Here, reducing the pressure in the processing space PS may be divided into two processes. First, a low-speed exhaust process (low-speed pressure reduction) of reducing the pressure in the processing space PS to a third pressure P3 may be performed. And then a high-speed exhaust process (high-speed pressure reduction) may be performed to reduce the pressure in the processing space PS to an initial pressure P0 similar to atmospheric pressure.

When the drying process on the substrate W is completed, the processing container 110 may be switched from the closed position to the open position, and the substrate may be unloaded from the processing space PS (S150).

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context indicates otherwise.

While the inventive concept has been particularly shown and described with reference to embodiments thereof, it will be understood that various changes in form and details may be made therein without departing from the spirit and scope of the following claims.

What is claimed is:

1. A substrate processing apparatus comprising: a processing container having a processing space;

a substrate support configured to support a substrate in the processing container;

a fluid supplier configured to supply a processing fluid in a supercritical state to the processing space through a container supply pipe;

a shower head assembly configured to diffuse the processing fluid supplied from the fluid supplier into the processing space;

a first laser portion configured to measure a horizontal alignment between the processing container and the shower head assembly;

a second laser portion configured to measure a vertical alignment between the processing container and the shower head assembly; and a controller configured to correct a position of at least one of the substrate, the shower head assembly, and the processing container, based on the measured horizontal and vertical alignments, wherein the first laser portion and the second laser portion are configured to be positioned in the processing container and to move above the substrate.

2. The substrate processing apparatus of claim 1, wherein the processing container is spaced apart from the shower head assembly so that a passage is formed between the processing container and the shower head assembly, and wherein the first laser portion is configured to measure a horizontal width of the passage.

3. The substrate processing apparatus of claim 2, wherein the first laser portion is arranged to vertically overlap the passage.

4. The substrate processing apparatus of claim 1, wherein the second laser portion is configured to measure a vertical distance from a top surface of the second laser portion to one of the processing container and the shower head assembly.

5. The substrate processing apparatus of claim 1, wherein the controller is configured to move the shower head assembly vertically based on the horizontal alignment measured by the first laser portion, and to correct an inclination of one of the shower head assembly and an upper body of the processing container, based on the vertical alignment measured by the second laser portion.

6. The substrate processing apparatus of claim 1, further comprising a jig positioned between the substrate and the first or second laser portion when the substrate is disposed on the substrate support, wherein the jig is configured to be connected to the substrate and has a disc shape.

7. The substrate processing apparatus of claim 6, further comprising a gyro sensor configured to be mounted on the jig and configured to measure an inclination of the substrate and a lower body of the processing container.

8. The substrate processing apparatus of claim 6, wherein the first laser portion and the second laser portion are configured to be mounted on the jig.

9. The substrate processing apparatus of claim 6, wherein a diameter of the jig is the same as a diameter of the substrate, and wherein the jig is configured to be spaced apart from the substrate when the substrate is disposed on the substrate support and the jig is positioned between the substrate and the first or second laser portion.

10. The substrate processing apparatus of claim 1, wherein the first laser portion is configured to measure a horizontal width of a passage formed between the processing container and the shower head assembly at at least three different points of the passage.

11. A substrate processing apparatus comprising: a processing container having a processing space;

a substrate support configured to support a substrate in the processing container;

a fluid supplier configured to supply a processing fluid in a supercritical state to the processing space through a container supply pipe;

a shower head assembly configured to diffuse the processing fluid supplied from the fluid supplier into the processing space;

a first laser portion configured to measure a horizontal alignment between the processing container and the shower head assembly;

a second laser portion configured to measure a vertical alignment between the processing container and the shower head assembly;

a jig configured to be positioned between the substrate and the first or second laser portions when the substrate is disposed on the substrate support; and a gyro sensor configured to be mounted on the jig and configured to measure an inclination of the substrate or a lower body of the processing container, wherein each of the first laser portion and the second laser portion is configured to emit laser beams toward one of the processing container and the shower head assembly at at least three different points on the jig.

12. The substrate processing apparatus of claim 11, wherein an inner wall of the processing container includes an inclined surface inclined with respect to an upper surface of the shower head assembly, and wherein the processing container is spaced apart from the shower head assembly to form a passage between the processing container and the shower head assembly.

13. The substrate processing apparatus of claim 11, wherein the processing container comprises a lower body and an upper body disposed above the lower body, wherein the lower body is vertically spaced apart from the upper body, and wherein the first and second laser portions and the gyro sensor are configured to be positioned between the lower body and the upper body.

14. The substrate processing apparatus of claim 11, wherein the jig having a disc shape or a bar shape is configured such that the first laser portion, the second laser portion, and a gyro sensor are mounted on the jig.

15. The substrate processing apparatus of claim 11, further comprising a controller configured to calculate alignment of each of the substrate, the processing container, and the shower head assembly by using the first laser portion, the second laser portion, and the gyro sensor.

16. The substrate processing apparatus of claim 15, wherein the first laser portion is configured to be disposed to vertically overlap a passage formed between the processing container and the shower head assembly and to measure a horizontal width of the passage, and wherein the controller is configured to calculate a separation distance between a central axis of an upper body of the processing container and a central axis of the shower head assembly, based on the horizontal width.

17. The substrate processing apparatus of claim 15, wherein the second laser portion is configured to measure a vertical distance between a top surface of the second laser portion and one of an upper body of the processing container and the shower head assembly, and wherein the controller is configured to calculate an inclination of one of the upper body of the processing container and the shower head assembly with respect to the substrate, based on the vertical distance.

* * * * *